United States Patent [19]
Takahashi

[11] Patent Number: 5,892,616
[45] Date of Patent: Apr. 6, 1999

[54] OPTICAL AMPLIFIER WITH REDUCED SURGE OUTPUT

[75] Inventor: Tsukasa Takahashi, Sapporo, Japan

[73] Assignee: Fujitsu Limited, Kawasaki, Japan

[21] Appl. No.: 890,159

[22] Filed: Jul. 10, 1997

[30] Foreign Application Priority Data

Jan. 27, 1997 [JP] Japan ................................. 9-008448

[51] Int. Cl.$^6$ ...................................................... H03F 1/26
[52] U.S. Cl. ........................................... 359/341; 359/177
[58] Field of Search ................................. 359/341, 161, 359/177

[56] References Cited

U.S. PATENT DOCUMENTS

| | | | |
|---|---|---|---|
| 5,589,975 | 12/1996 | Nakamura et al. | 359/345 |
| 5,701,195 | 12/1997 | Chikama | 359/341 |
| 5,703,711 | 12/1997 | Hamoda | 359/341 |
| 5,737,118 | 4/1998 | Sugaya et al. | 359/341 |

OTHER PUBLICATIONS

Aoki et al., Optical Amplifier, *Patent Abstracts of Japan*, JP–A–07240717, 12 Aug. 1995.

*Primary Examiner*—Mark Hellner
*Attorney, Agent, or Firm*—Staas & Halsey

[57] ABSTRACT

An optical amplifier changes a characteristic of controlling a current supplied to an exciter laser diode in response to the level of an optical input signal provided to the optical amplifier, thereby reducing a surge in the optical output of the optical amplifier caused by a sudden fluctuation in the optical input signal. The optical amplifier has an input variation detector and an automatic level controller. The input variation detector provides a signal that represents a change in the optical input signal. The automatic level controller controls an excitation beam according to a monitor signal from an optical output monitor, so that the optical output signal keeps a constant level. The automatic level controller has a loop gain controller that controls the gain of an automatic level controlling loop according to the signal from the input variation detector.

9 Claims, 12 Drawing Sheets

BREAK/
RESTORATION
DETECTION
LEVEL

USUAL
DETECTION
LEVEL $\tau_{2eff}$

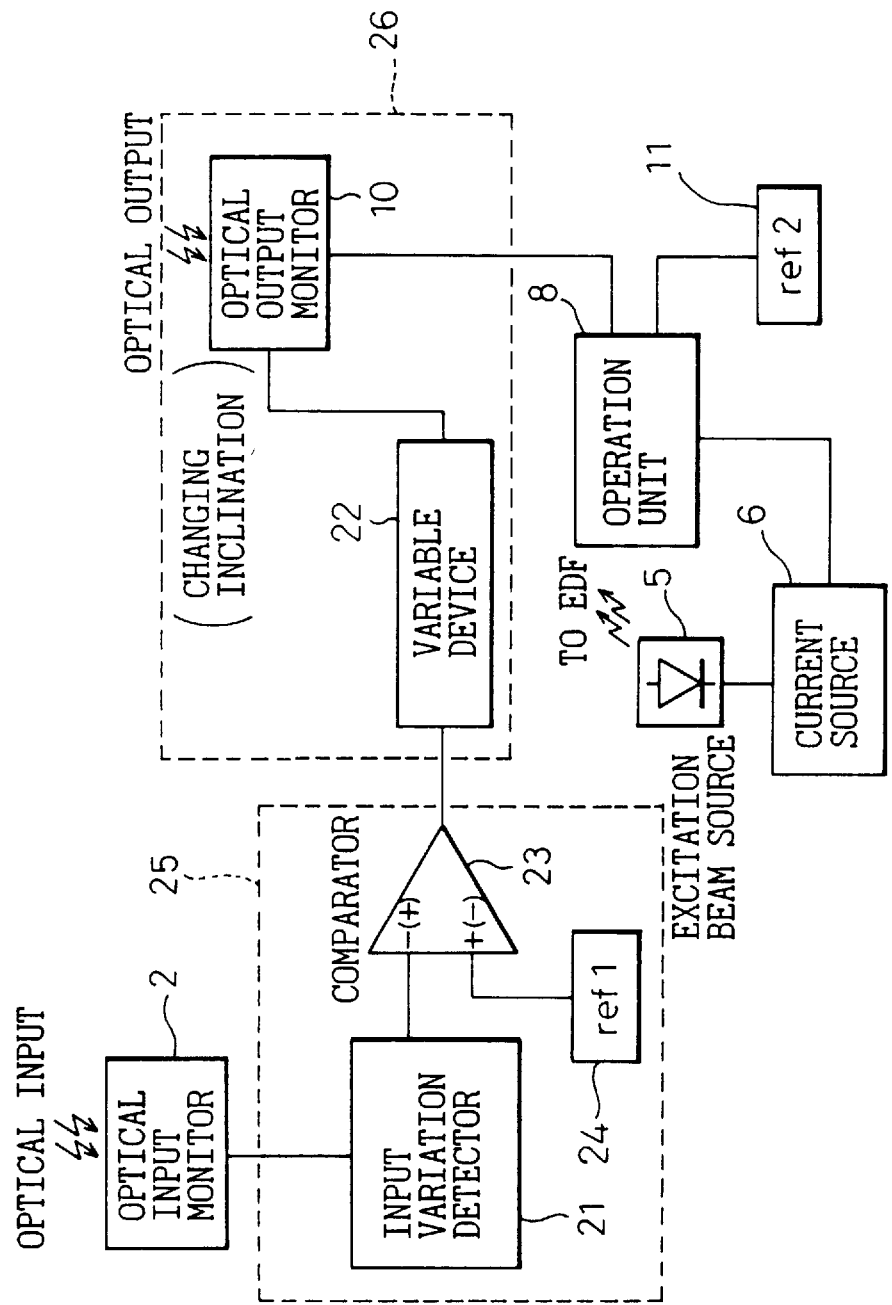

BREAK/
RESTORATION
DETECTION
LEVEL $\tau_{2eff}$

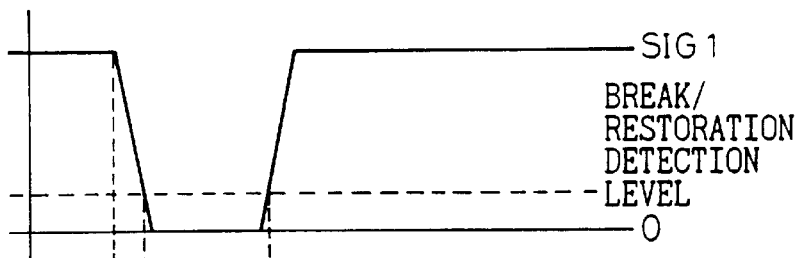
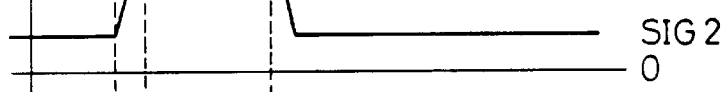
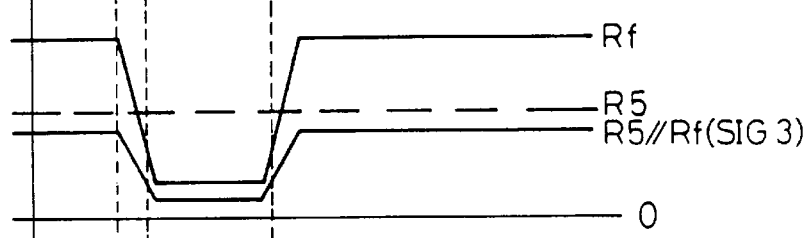
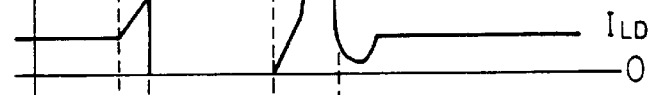

OPTICAL AMPLIFIER WITH REDUCED SURGE OUTPUT

BACKGROUND OF THE INVENTION

1. Field of the Invention

The present invention relates to an optical amplifier, and particularly, to one that changes a characteristic of controlling a current that drives an exciter laser diode, in response to the level of an optical input signal, to reduce a surge in the output of the optical amplifier when the optical input signal suddenly varies.

2. Description of the Related Art

Optical amplifiers are used for optical transmission systems. Optical power in the optical transmission system varies if an optical fiber loss fluctuates or an optical input signal suffers a short break due to maintenance or circuit switching. At this time, an erbium-doped optical fiber (EDF) serving as a part of the optical amplifier produces a surge due to induced emission.

The output of the optical amplifier involving the surge is applied to an optical-to-electrical converter composed of photosensors. The photosensors have a limit on the power of light they can accept. If the surge exceeds the rating of the photosensors, an overcurrent flows to destroy the photosensors. The optical amplifiers, therefore, must suppress such a surge output caused when an optical input signal thereto suddenly fluctuates.

Conventional optical amplifiers having an ALC (automatic level controller) have the problem of providing a surge when an optical input signal thereto involves a short break. If the surge is large, it will break elements contained in relays and terminals installed at a receiving party.

SUMMARY OF THE INVENTION

An object of the present invention is to provide an optical amplifier that changes the band and gain of an ALC or the current/voltage (I/V) conversion factor of an output monitor in response to the level of an optical input signal, to thereby control a current flowing to an exciter laser diode, i.e., energy injected into an erbium-doped fiber when the level of the optical input signal suddenly drops. Namely, this optical amplifier minimizes a surge to be produced when an optical input signal rises.

In order to accomplish the object, a first aspect of the present invention provides an optical amplifier having an optical fiber, an input variation detector, an output monitor, and an automatic level controller. The optical fiber amplifies an optical input signal with the use of an excitation beam. The input variation detector provides a variation signal that represents a change in the optical input signal. The output monitor provides a monitor signal that represents an amplified optical output signal provided by the optical fiber. The automatic level controller controls the excitation beam according to the monitor signal so that the optical output signal keeps a constant level. The automatic level controller of the first aspect has a gain controller for controlling the gain of an automatic level controlling loop according to the variation signal.

A second aspect of the present invention provides an optical amplifier having an optical fiber, an input variation detector, an output monitor, and an automatic level controller. The optical fiber amplifies an optical input signal with the use of an excitation beam. The input variation detector provides a variation signal that represents a change in the optical input signal. The output monitor provides a monitor signal that represents an amplified optical output signal provided by the optical fiber. The automatic level controller controls the excitation beam according the monitor signal so that the optical output signal keeps a constant level. The output monitor of the second aspect has a variable device that variably controls a conversion factor used to convert the optical output signal into the monitor signal. The variable device changes the conversion factor according to the variation signal.

In this way, the present invention controls the response characteristic of the automatic level controlling loop according to the level of the monitor signal that represents an optical output signal. Even if an optical input signal suddenly fluctuates due to a short break and due to resumption after the short break, the present invention properly controls an excitation current that is used to inject energy into the erbium-doped fiber, thereby preventing a surge in the output of the optical amplifier.

BRIEF DESCRIPTION OF THE DRAWINGS

The present invention will be more clearly understood from the description of the preferred embodiments as set forth below with reference to the accompanying drawings, wherein:

FIG. 4 shows a surge suppressing block of an optical amplifier according to the second aspect of the present invention;

FIG. 7 is a time chart showing the operation of the circuit of FIG. 6;

DESCRIPTION OF THE PREFERRED EMBODIMENTS

For a better understanding of the preferred embodiments of the present invention, the problem in the prior art will be explained with reference to the drawings.

Figure 1:
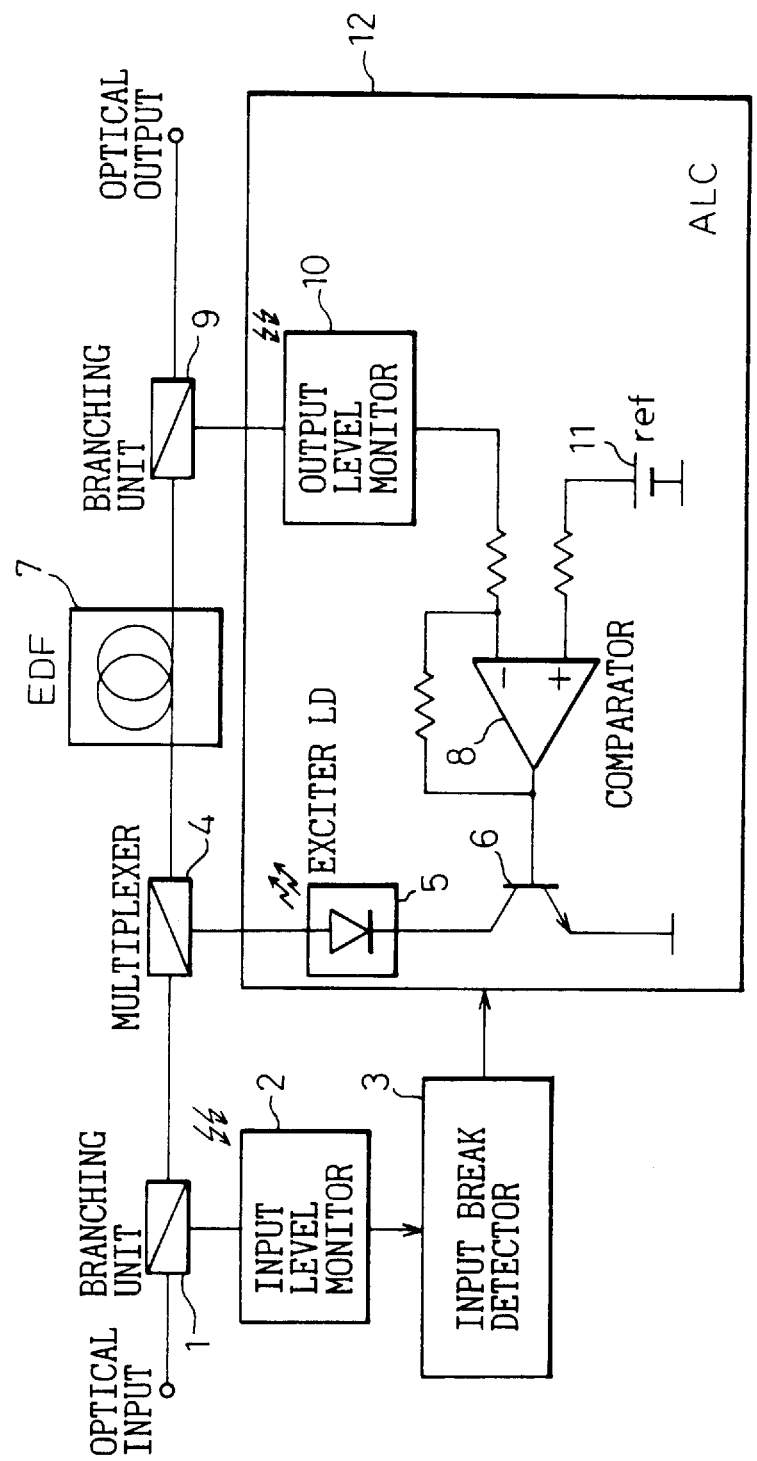
FIG. 1 shows the basic structure of an optical amplifier according to a prior art.

FIG. 1 shows the basic structure of an optical amplifier according to the prior art. An automatic level controller (ALC) 12 controls an optical output signal to a constant level.

A branching unit 1 branches an optical input signal into a main signal and a branched signal. The main signal is transferred to a multiplexer 4. An input level monitor 2 consists of photodiodes, etc., to monitor the level of the branched signal.

An input break detector 3 compares the level of an input monitor signal provided by the input level monitor 2 with a reference level. If the input monitor signal is below the reference level, the input break detector 3 detects an input break and stops the exciting operation of the ALC 12. The multiplexer 4 multiplexes the main signal with an excitation beam provided by the ALC 12 and provides an erbium-doped fiber 7 with the multiplexed optical signal.

The erbium-doped fiber 7 directly amplifies the main signal by the pumping action of the excitation beam. The amplified optical signal is provided to the outside through a branching unit 9. A branched optical output signal from the branching unit 9 is supplied to the ALC 12.

The ALC 12 has an output level monitor 10 consisting of photodiodes, etc. The output level monitor 10 monitors the branched output signal and provides an output monitor signal. A comparator 8 compares the output monitor signal with a reference voltage 11. If the output monitor signal is larger than the reference voltage 11, the comparator 8 provides a driver transistor 6 with a signal to drop a driving current to decrease the optical output. If the output monitor signal is lower than the reference voltage 11, the comparator 8 provides the driver transistor 6 with a signal to increase the driving current.

The driver transistor 6 controls the driving current that drives an exciter laser diode 5, which provides the multiplexer 4 with an excitation beam. The excitation beam activates the amplification action of the erbium-doped fiber 7 in a way to equalize the output monitor signal with the reference voltage 11.

In this way, the ALC 12 increases the driving current to the exciter laser diode 5 if the output of the optical amplifier is below a given level, and if it is above the given level, decreases or turns off the driving current until the output drops to the given level. Namely, the ALC 12 carries out a negative feedback control to maintain the output of the optical amplifier at the given level.

If a break is detected in the optical input signal, the input break detector 3 turns off the driver transistor 6 and disables the automatic level controlling operation.

Figure 2A:
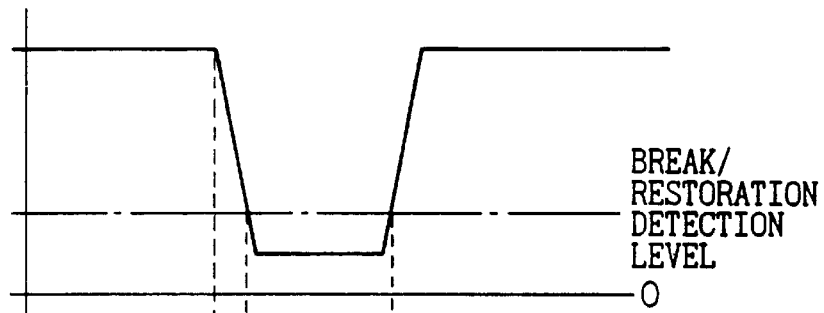
FIG. 2 shows an optical input signal involving a short break and a corresponding optical output signal according to the prior art.
Figure 2B:
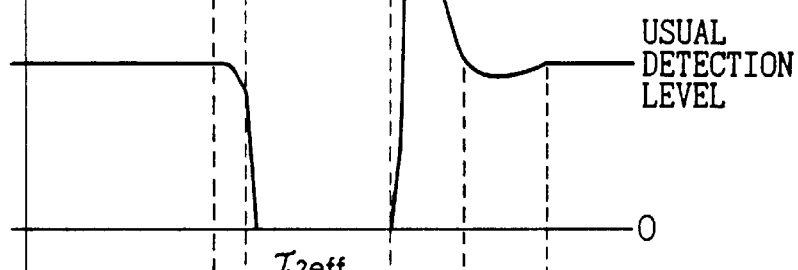
Figure 2C:
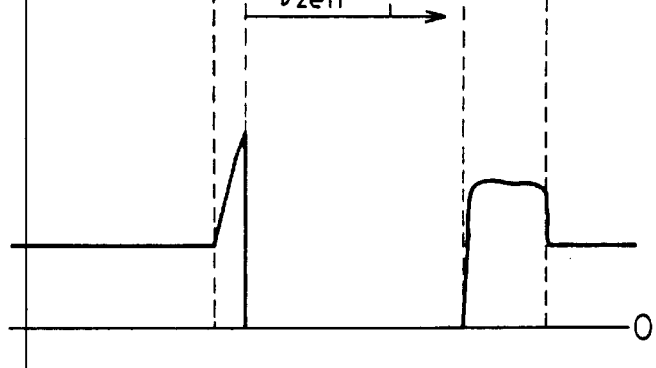

FIG. 2 shows an optical input signal involving a short break and a corresponding optical output signal according to the prior art of FIG. 1. Namely, FIG. 2(a) shows the optical input signal involving a short break and supplied to the optical amplifier, FIG. 2(b) shows the corresponding optical output signal provided by the optical amplifier, and FIG. 2(c) shows a driving current applied to the exciter laser diode 5.

If a change in an average of the optical input signal is slower than the upper-excitation level life ($\tau_{2eff}$) of excitation erbium ions in the erbium-doped fiber 7, the gain coefficient of the optical amplifier changes according to the optical input signal, to cause an amplification surge. The surge becomes conspicuous as an average of the optical input signal increases.

Just after the start of the short break of FIG. 2(a), there is a period in which the input signal is still above a break/restoration detection level. During this period, the ALC 12 drives the exciter laser diode 5, to prevent a drop in the output power. As a result, a current to the diode 5 increases during this period as shown in FIG. 2(c).

When the input signal drops below the break/restoration detection level, the input break detector 3 stops the excitation action (FIG. 2(c)). Thereafter, the output signal of FIG. 2(b) follows the input signal. Then, the input signal is restored to the original level. If reactivation is earlier than the life (several to several tens of milliseconds) of erbium ions excited to an upper-excitation level, the erbium-doped fiber 7 emits many stimulated electrons at the restoration of the optical input signal because the erbium-doped fiber 7 holds the excitation power increased just after the start of the short break.

Consequently, the optical amplifier produces a large surge in the output thereof as shown in FIG. 2(b). The current to drive the exciter laser diode 5 increases as a rebound after the surge and converges to a usual level as shown in FIG. 2(c). In this way, the optical amplifier having the ALC 12 of the prior art produces a large surge in the output thereof whenever a short break occurs in an optical input signal. If the surge is large, it will destroy relays and terminals installed at a receiving party.

Now, the present invention will be explained.

Figure 3:
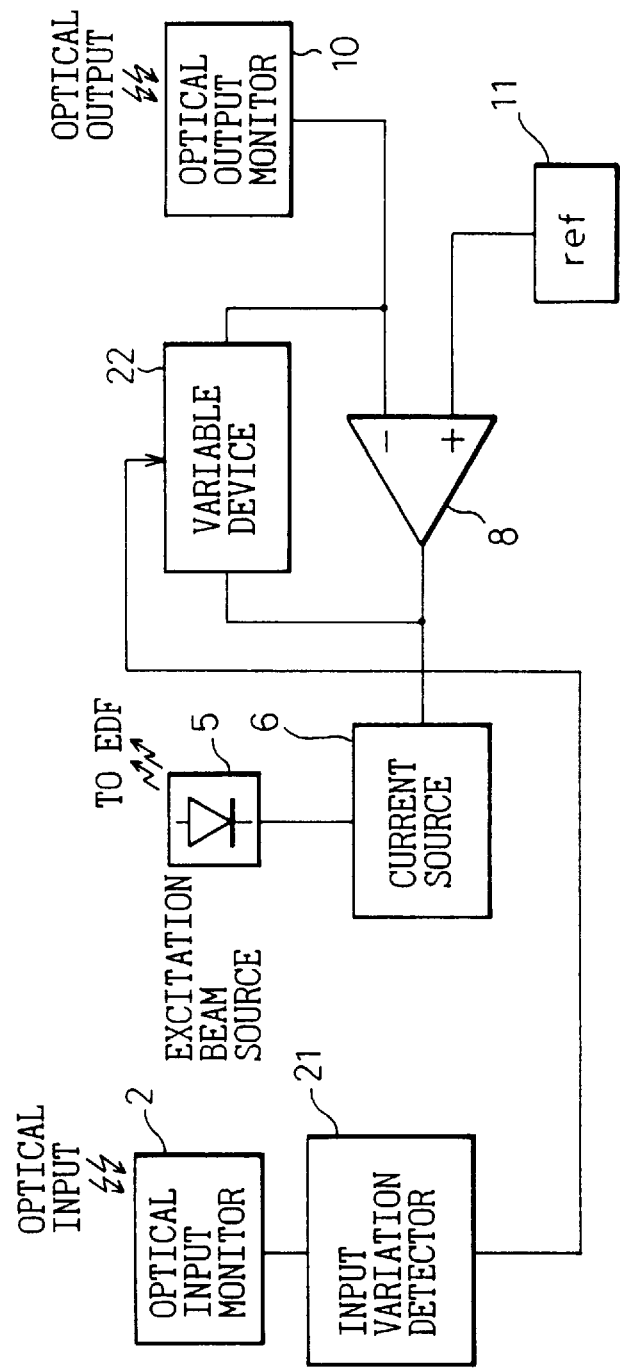
FIG. 3 shows a surge suppressing block of an optical amplifier according to the first aspect of the present invention.

FIG. 3 shows a surge suppressing block of an optical amplifier according to the first aspect of the present invention, and FIG. 4 shows a surge suppressing block of an optical amplifier according to the second aspect of the present invention. The same parts as those of the prior art are represented with like reference marks and are not explained again.

In FIG. 3, an optical input monitor 2 provides an electric input monitor signal that represents the level of an optical input signal. An input variation detector 21 provides a variation signal that represents a variation in the input monitor signal. The variation signal may directly represent the variation, or may be a resultant signal of comparison of the variation with reference values.

A variable device 22 receives the variation signal and limits the gain or band of a comparator 8. The variable device 22 changes its resistance or capacitance in response to the variation signal. For example, the variable device 22 is a combination of field effect transistors and varactor diodes, or a combination of relays, analog switches, resistors, and capacitors.

The present invention employs the input variation detector 21 to control the resistance or capacitance of the variable device 22 if a short break occurs in the optical input signal. Dropping the resistance of the variable device 22 results in dropping the gain of an automatic level controlling loop. Increasing the capacitance of the variable device 22 results in dropping the throughput of the loop.

In this way, the present invention controls the response characteristic of the automatic level controlling loop in response to an optical input monitor signal, to prevent a high excitation current from flowing to an exciter laser diode 5 when an optical input signal suddenly fluctuates. Namely, the present invention prevents sudden energy from being injected into an erbium-doped fiber, thereby minimizing a surge in the output of the optical amplifier when the optical input signal is restored to an original level.

In FIG. 3, the variable device 22 serves as a feedback resistor for the comparator 8. On the other hand, the structure of FIG. 4 varies, for example, the I/V characteristic of an output monitor signal provided by an optical output monitor 10 in response to a change in an input monitor signal provided by an input variation detector 21. The structure of FIG. 4 provides the same effect as the structure of FIG. 3.

In FIG. 4, a comparator 23 compares the output of the input variation detector 21 with a reference voltage 24 and provides a select signal of 1 or 0 accordingly. The select signal is supplied to a variable device 22, which includes a resistor and a capacitor one of which is selected by the select signal. The output of the comparator 23 may continuously change to continuously vary the output of the variable device 22.

The optical output monitor 10 employs a conversion factor to convert an optical output monitor current into a voltage. The slope (I/V characteristic) of the conversion factor varies in response to the output of the variable device 22. When a short break occurs in an optical input signal, the variable device 22 is properly controlled to drop the gain or throughput of an automatic level controlling loop.

In FIG. 4, the dotted block 25 is an input variation detecting function block and the dotted block 26 is an optical output monitoring function block that is controlled by the input variation detecting function.

Figure 5A:
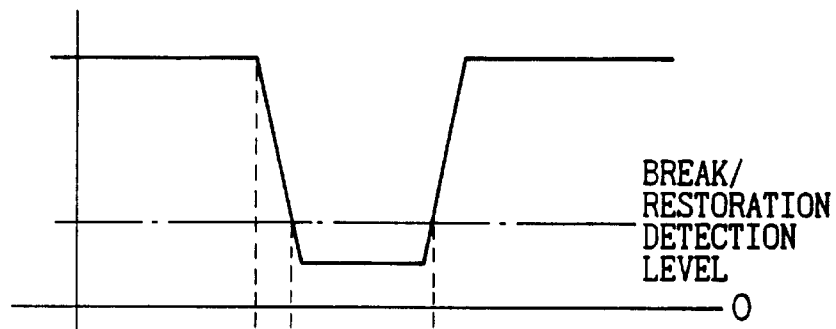
FIG. 5 shows an optical input signal involving a short break and a corresponding optical output signal according to the present invention.
Figure 5B:
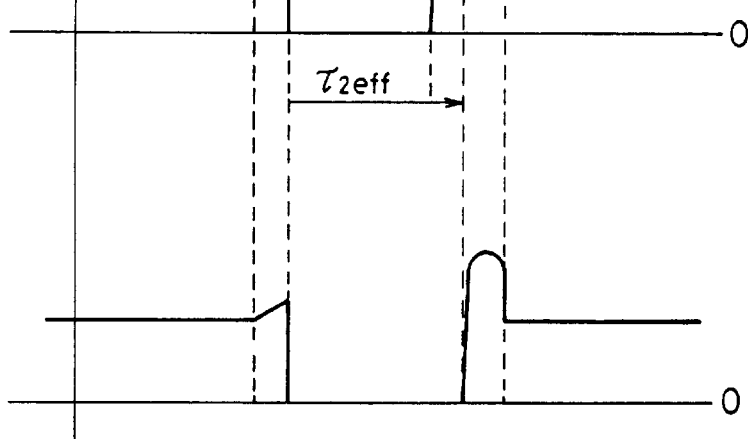
Figure 5C:
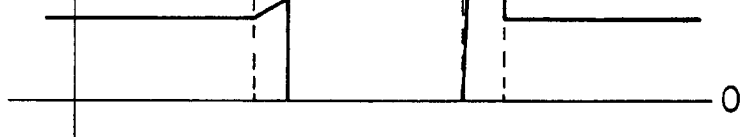

FIG. 5 shows an optical input signal involving a short break and a corresponding optical output signal in the optical amplifier of any one of FIGS. 3 and 4. FIG. 5(a) shows the optical input signal involving a short break and supplied to the optical amplifier, FIG. 5(b) shows the corresponding optical output signal provided by the optical amplifier, and FIG. 5(c) shows a current for driving the exciter laser diode 5.

In FIG. 5(c), the inclination of the driving current between the start of the short break and the stoppage of the excitation laser diode 5 is smaller than that of the prior art of FIG. 2. Namely, the present invention prevents a steep excitation current from flowing to the excitation laser diode 5. As a result, energy injected into the erbium-doped fiber never increases suddenly, and therefore, an output surge at the resumption of the optical input signal is minimized as shown in FIG. 5(b).

Figure 6:
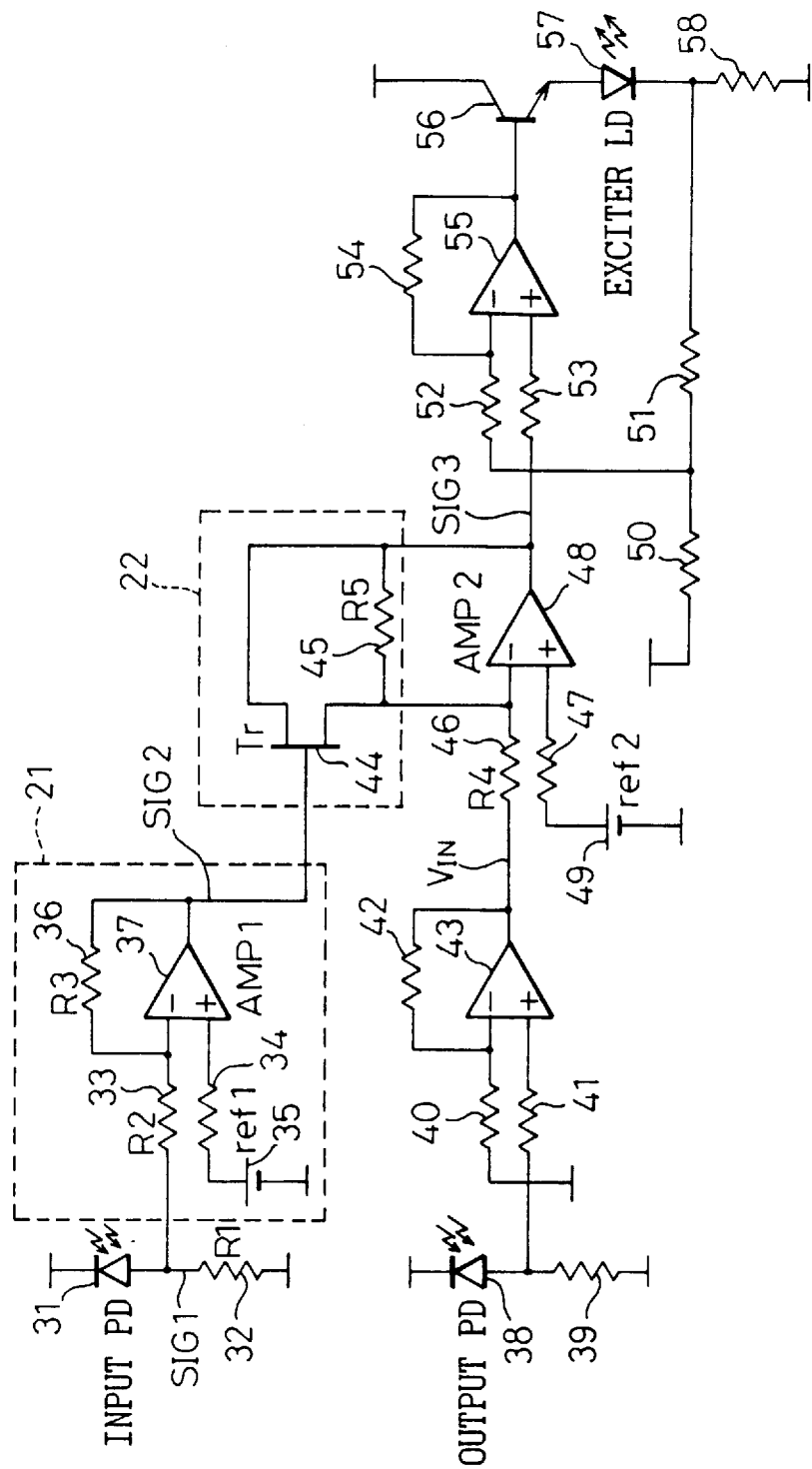
FIG. 6 shows a circuit based on the first aspect of FIG. 3 of the present invention.

FIG. 6 shows a circuit based on the first aspect of FIG. 3.

FIG. 7 is a time chart showing the operation of the circuit of FIG. 6, in which FIG. 7(a) shows an optical input signal involving a short break, FIG. 7(b) shows the output of an operational amplifier 37, FIG. 7(c) shows the combined resistance of the internal resistance Rf of a transistor 44 and the resistance R5 of a resistor 45, FIG. 7(d) shows a current for driving an exciter laser diode 57, and FIG. 7(e) shows an optical output signal provided by the optical amplifier.

In FIG. 6, a photodiode 31 detects the optical input signal and provides a current. A resistor 32 converts the current into a voltage. A dotted block 21 corresponds to the input variation detector 21 of FIG. 3. In the block 21, the operational amplifier 37 provides a gain of "–R3/R2" on a signal supplied to a negative input terminal thereof and a gain of "R3/R2+1" on a signal supplied to a positive input terminal thereof. In response to a monitor signal SIG1 appearing at the resistor 32, the operational amplifier 37 provides a linear output signal SIG2. A reference voltage 35 is used to detect a variation in the monitor signal SIG1. The signals SIG1 and SIG2 are expressed as follows:

$$SIG2 = ((R3/R2)+1) \, ref1 - (R3/R2) \, SIG1 \qquad (1)$$

where ref1 is the reference voltage 35.

A dotted block 22 in FIG. 6 corresponds to the variable device 22 of FIG. 3, and in this embodiment, is realized with a parallel combination of the internal resistance Rf of the field effect transistor 44 and the resistance R5 of the resistor 45. The internal resistance Rf of the transistor 44 changes in response to the voltage signal SIG2 of the expression (1). An operational amplifier 48 has the same structure as the operational amplifier 37. Accordingly, the output SIG3 of the operational amplifier 48 is expressed as follows:

$$SIG3 \left( \frac{R5//Rf}{R4} + 1 \right) ref2 - \left( \frac{R5//Rf}{R4} \right) Vin \qquad (2)$$

where ref2 is a reference voltage 49 and Vin is an output monitor signal.

The expression (1) indicates that the smaller the input monitor signal SIG1, the larger the output SIG2 of the operational amplifier 37 as shown in FIGS. 7(a) and 7(b). If the output SIG2 increases, the transistor 44 receives gate potential in an ON direction, to reduce the internal resistance Rf thereof as well as the combined resistance R5//Rf as shown in FIG. 7(c).

The expression (2) indicates that the smaller the combined resistance R5//Rf, the smaller the gain and output SIG3 of the operational amplifier 48. This results in lowering the gain of the ALC as well as an increase in the driving current flowing to the exciter laser diode 57 as shown in FIG. 7(d). Even if the optical input signal suddenly decreases, an increase in the excitation power is suppressed and a surge in the optical output signal is suppressed as shown in FIG. 7(e).

Figure 8:
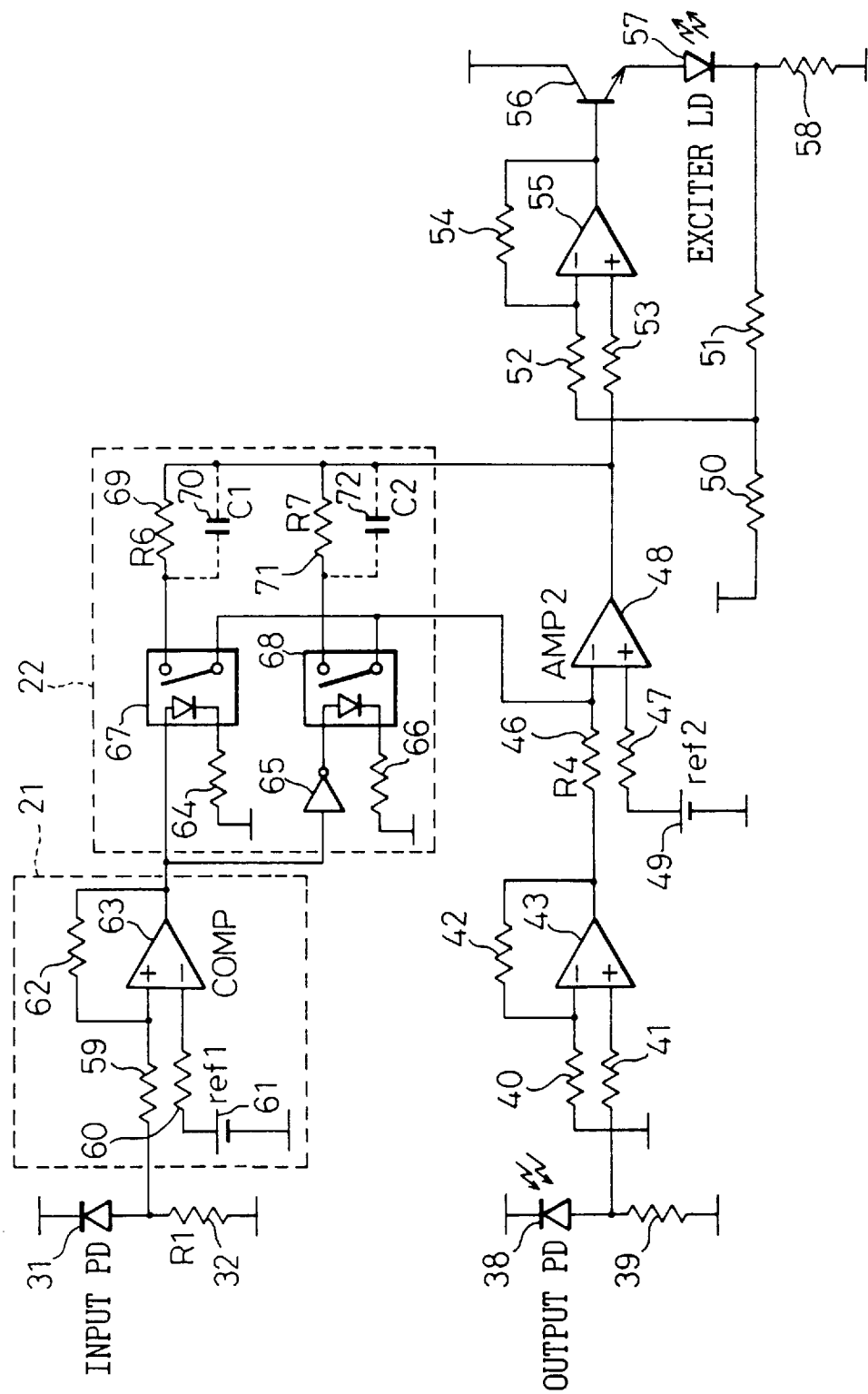
FIG. 8 shows another circuit based on the first aspect of FIG. 3 of the present invention.

FIG. 8 shows another circuit based on the first aspect of FIG. 3 of the present invention.

Figure 9:
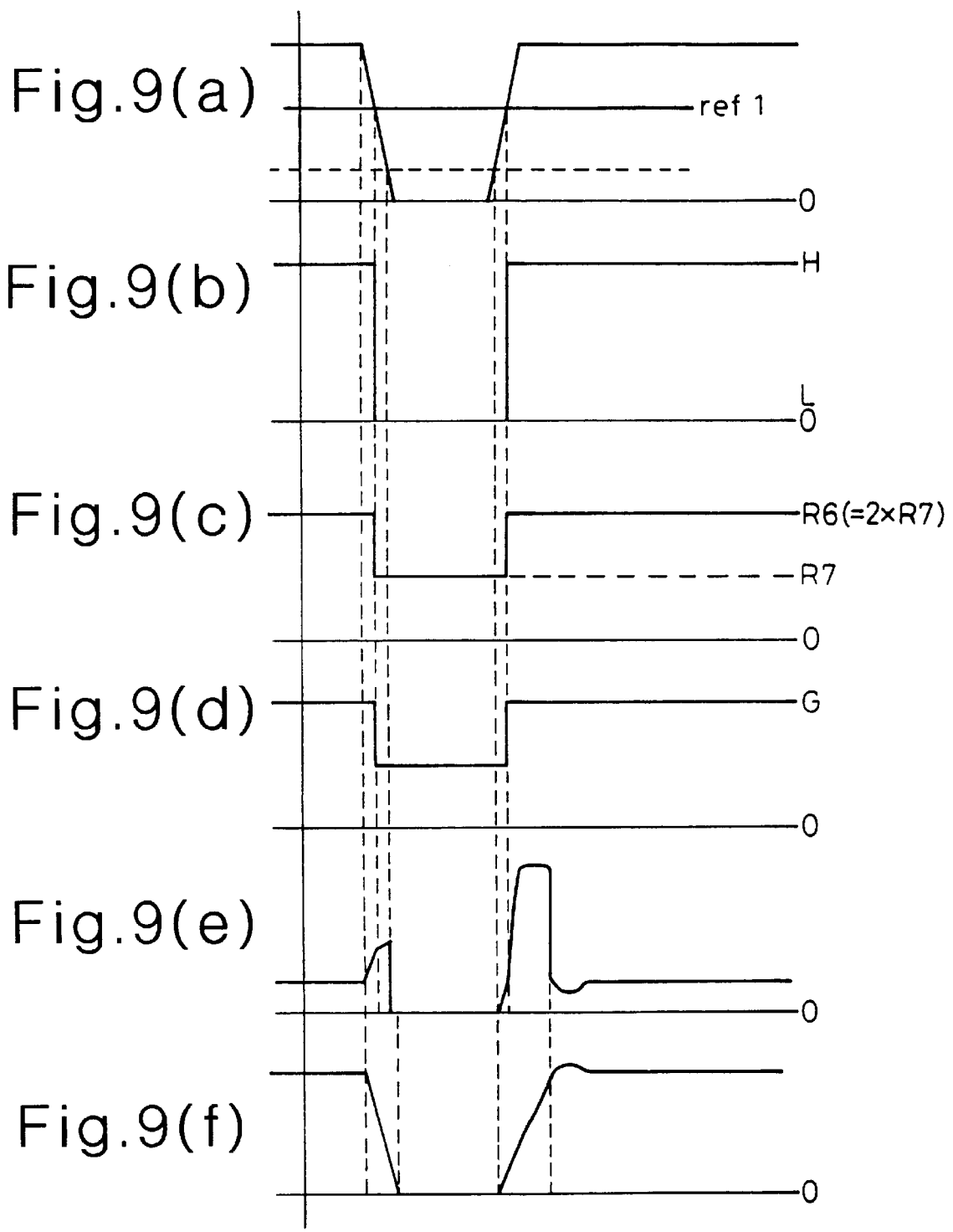
FIG. 9 is a time chart showing the operation of the circuit of FIG. 8.

FIG. 9 is a time chart showing the operation of the circuit of FIG. 8, in which FIG. 9(a) shows an optical input signal involving a short break, FIG. 9(b) shows the output of a comparator 21, FIG. 9(c) shows the resistance R6 or R7 of a selected one of feedback resistors 69 and 71, FIG. 9(d) shows the gain of an operational amplifier (AMP2) 48, FIG. 9(e) shows a current applied to an exciter laser diode 57, and FIG. 9(f) shows an optical output signal provided by the optical amplifier.

The comparator 21 corresponds to the input variation detector 21 of FIG. 3 and has an operational amplifier 63. A photodiode 31 provides an input monitor signal, and the comparator 21 compares the input monitor signal with an internal reference voltage (ref1) 61. If the input monitor signal is greater than the reference voltage ref1, the comparator 21 provides a high-level signal of "1" to indicate that there is no short break. If the input monitor signal is lower than the reference voltage ref1, the comparator 21 provides a low-level signal of "0" to indicate a short break, as shown in FIGS. 9(a) and 9(b). The reference voltage ref1 is set to a predetermined variation value to be detected, as shown in FIG. 9(a).

The output of the comparator 21 is supplied to a circuit 22. The circuit 22 consists of a combination of discrete parts and switches and corresponds to the variable device 22 of FIG. 4. The circuit 22 employs relays 67 and 68 that are photo-MOS relay switches. An inverter 65 is used to select one of the relays 67 and 68 according to the output of the comparator 21. If the output is 1, the relay 67 is selected, and if it is 0, the relay 68 is selected.

If there is no short break, the relay 67 is selected, and therefore, the resistor (R6) 69 is selected as a feedback resistor for the operational amplifier 48. If there is a short break, the relay 68 is selected to select the resistor (R7) 71 as shown in FIG. 9(c). If R6=2×R7, the gain G of the operational amplifier 48 is halved from R6/R4 to R7/R4 as shown in FIG. 9(d). FIGS. 9(d) and 9(e) are the same as FIGS. 7(d) and 7(e). Capacitors (C1, C2) 70 and 72 are used to change the frequency response characteristic of the automatic level controlling loop.

Figure 10:
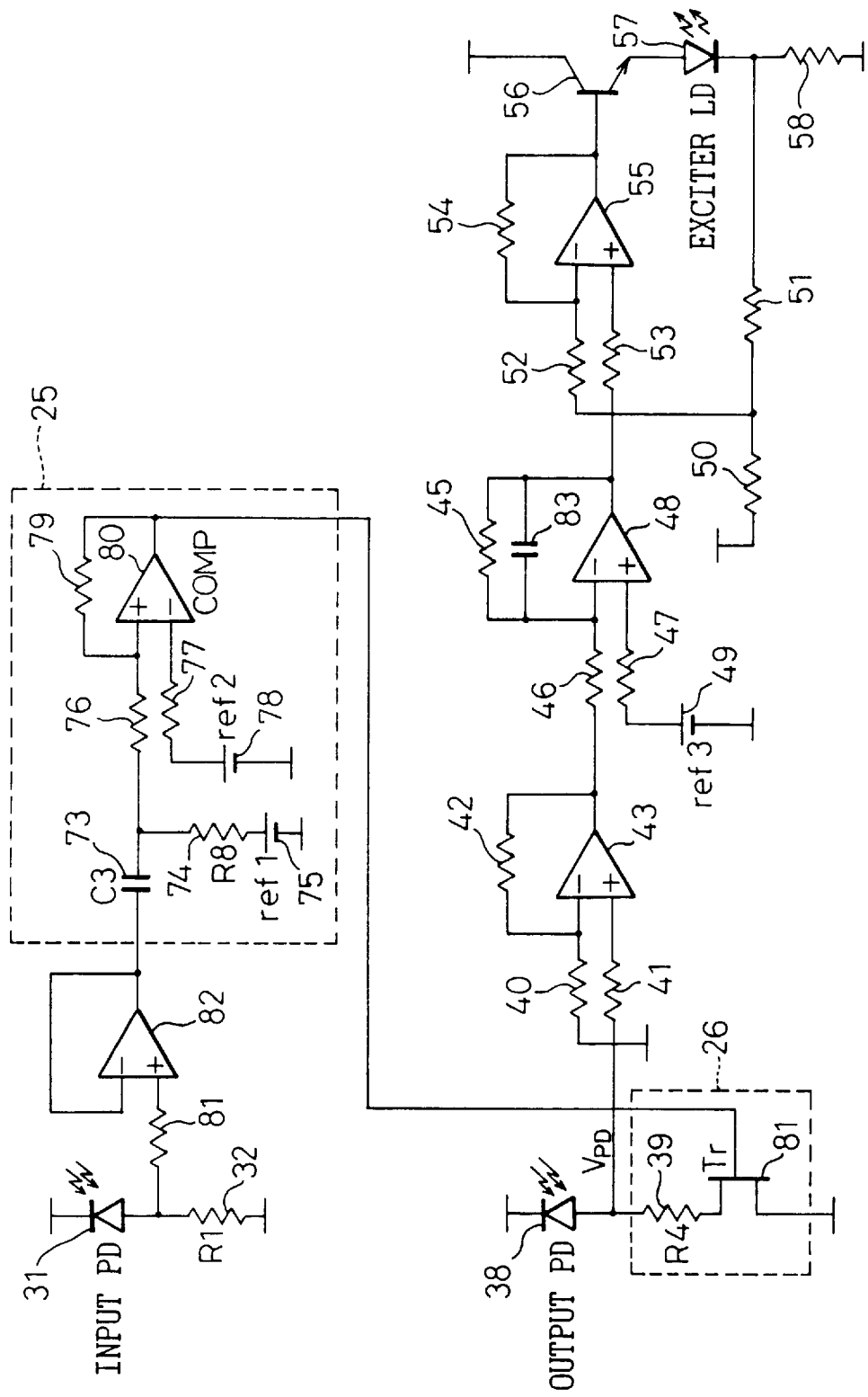
FIG. 10 shows a circuit based on the second aspect of FIG. 4 of the present invention.

FIG. 10 shows a circuit based on the second aspect of FIG. 4 of the present invention.

Figure 11:
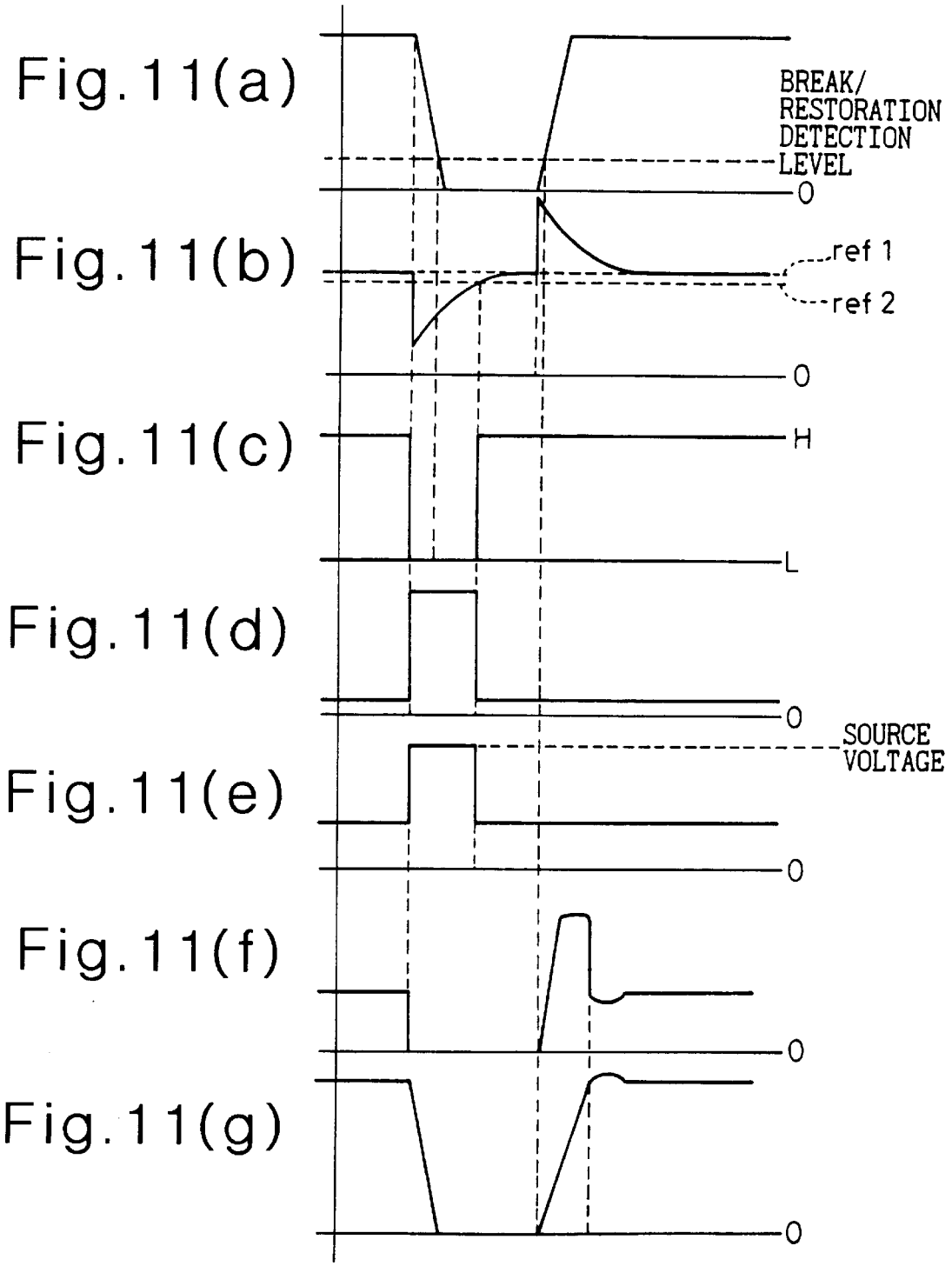
FIG. 11 is a time chart showing the operation of the circuit of FIG. 10.

FIG. 11 is a time chart showing the operation of the circuit of FIG. 10, in which FIG. 11(a) shows an optical input signal involving a short break, FIG. 11(b) shows the output of a differential circuit (73, 74), FIG. 11(c) shows the output of a comparator 80, FIG. 11(d) shows the internal resistance Rf of a field effect transistor, FIG. 11(e) shows an output monitor signal, FIG. 11(f) shows a driving current supplied to an exciter laser diode 57, and FIG. 11(g) shows an optical output signal.

In FIG. 10, a dotted block 25 is an input variation detector 25 and corresponds to the input variation detecting function block 25 of FIG. 4. A dotted block 26 corresponds to the optical output monitoring function block 26 of FIG. 4. A photodiode 31 provides an input monitor signal (FIG. 11(a)), which is buffered by an operational amplifier 82 having a voltage follower structure. The output of the operational amplifier 82 is given to the input variation detector 25.

The input monitor signal passes through the differential circuit which is present at an input stage of the input variation detector 25 and consists of a capacitor (C3) 73 and a resistor (R8) 74. The comparator 80 detects a falling edge of the input monitor signal. The falling edge is detectable by setting a reference voltage (ref1) 75 to be smaller than a reference voltage (ref2) 78. The comparator 80 provides a low-level signal of "0" when detecting a falling edge, as shown in FIGS. 11(b) and 11(c).

If the comparator 80 provides an output of "1" to indicate that there is no short break, a field effect transistor 81 of the optical output monitor 26 is turned on. As a result, the resistance of an output photodiode 38 serving as an I/V converter becomes the sum of the ON resistance Rf of the transistor 81 and the resistance R4 of a resistor 39. If the comparator 80 provides an output of "0" to indicate a short break, the transistor 81 is turned off and becomes high impedance, as shown in FIG. 11(d). In this case, no current flows to the photodiode 38, and therefore, the output voltage VPD of the optical output monitor 26 becomes a source cathode voltage without regard to the state of the optical output signal, as shown in FIG. 11(e).

Due to the high value of the voltage VPD, the ALC determines that the output power of the optical amplifier is increasing, and therefore, decreases the current to the exciter laser diode. In this way, this embodiment suppresses the excitation power as well as a surge if the optical input signal suddenly decreases.

Figure 12:
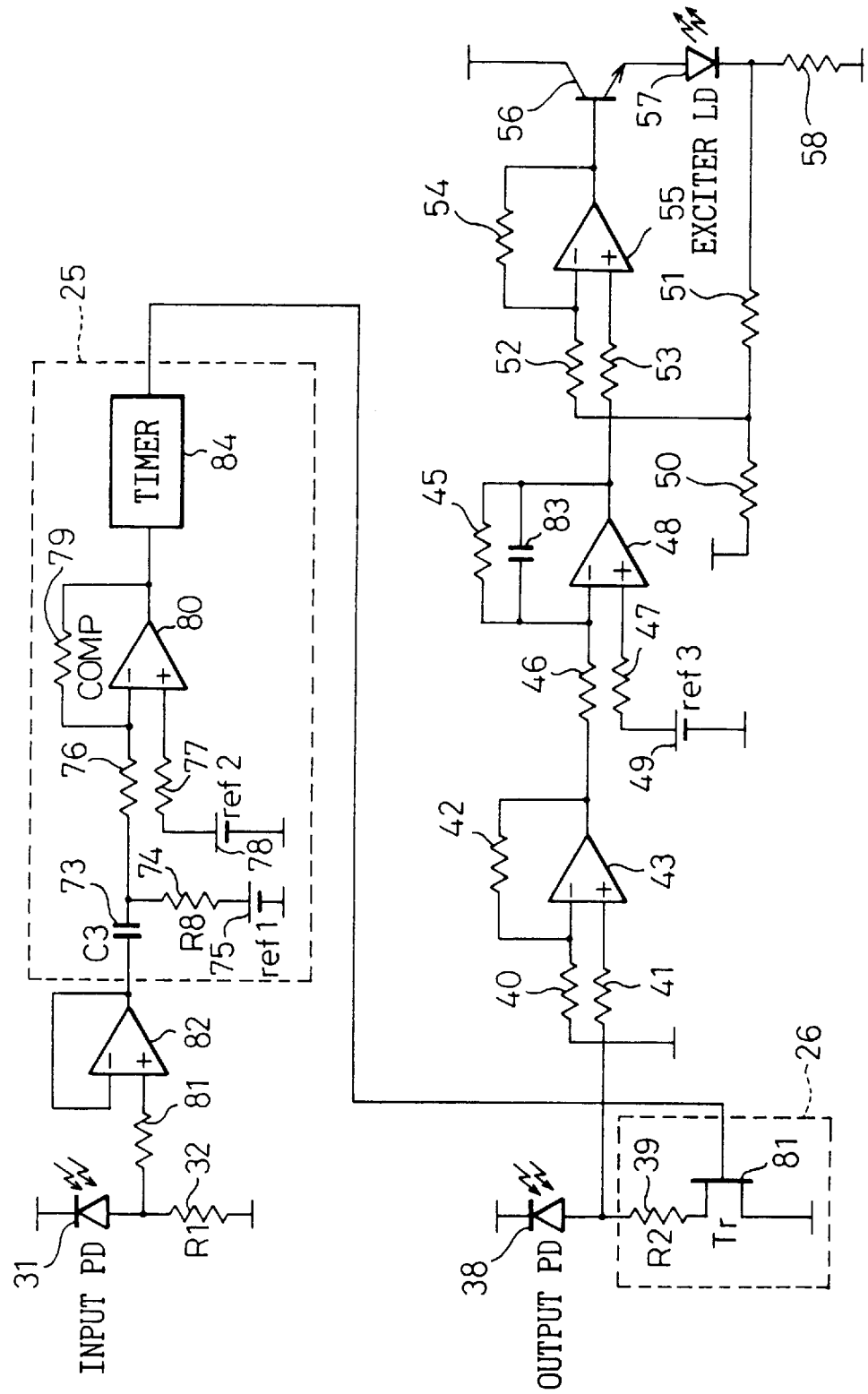
FIG. 12 shows another circuit based on the second aspect of FIG. 4 of the present invention.

FIG. 12 shows another circuit based on the second aspect of FIG. 4 of the present invention.

This circuit differs from the circuit of FIG. 10 in that it has a timer 84. The timer 84 is a one-shot-type timer that provides a low-level output only for a given period after a comparator 80 provides a low level signal of "0" to indicate a short break. The timer 84 absorbs the influence of the width and inclination of a surge due to a differential circuit (73, 74), to secure a time for reducing excitation power.

As explained above, the present invention controls the response characteristic of an automatic level controlling loop of an optical amplifier in response to the level of an input monitor signal. Even if an optical input signal to the optical amplifier suddenly fluctuates, the present invention controls the automatic level controlling loop not to suddenly increase a current for stimulating an exciter laser diode. As a result, the quantity of energy to be injected into an erbium-doped fiber does not suddenly increase, and a surge in the output of the optical amplifier is minimized when the optical input signal is restored to an original level after the sudden fluctuation.

What is claimed is:

1. An optical amplifier comprising:

an optical fiber for amplifying an optical input signal according to an excitation beam;

an input variation detector for providing a variation signal that represents a change in the optical input signal;

an output monitor for providing a monitor signal that represents an amplified optical output signal provided by the optical fiber;

an automatic level controller for controlling the excitation beam according the monitor signal so that the optical output signal keeps a constant level; and a gain controller disposed in the automatic level controller, for controlling the gain of an automatic level controlling loop according to the variation signal.

2. The optical amplifier of claim 1, wherein the automatic level controller employs an amplifier in the automatic level controlling loop, for providing a gain, and the gain controller is a resistor for varying the gain of the amplifier.

3. The optical amplifier of claim 2, wherein the resistor is a field effect transistor that is controlled by the variation signal, or a combination of resistors and capacitors to be selected by the variation signal.

4. An optical amplifier comprising:

an optical fiber for amplifying an optical input signal according to an excitation beam;

an input variation detector for providing a variation signal that represents a change in the optical input signal;

an output monitor for providing a monitor signal that represents an amplified optical output signal provided by the optical fiber;

an automatic level controller for controlling the excitation beam according the monitor signal so that the optical output signal keeps a constant level; and a variable device disposed in the automatic level controller, for variably controlling, according to the variation signal, a conversion factor used to convert the optical output signal into the monitor signal.

5. The optical amplifier of claim 4, wherein the variable device is a resistor for converting a monitor current detected by a photodiode into a voltage.

6. The optical amplifier of claim 5, wherein the resistor is a field effect transistor controlled by the variation signal, or resistor parts that are selected by the variation signal.

7. The optical amplifier of claim 1, wherein the input variation detector is a differential circuit for detecting a falling edge of the optical input signal.

8. The optical amplifier of claim 7, wherein the input variation detector further has a timer circuit that maintains a detected state for a given period after detecting a falling edge of the optical input signal.

9. The optical amplifier of claim 4, wherein the input variation detector is a differential circuit for detecting a falling edge of the optical input signal.

* * * * *

UNITED STATES PATENT AND TRADEMARK OFFICE
CERTIFICATE OF CORRECTION

PATENT NO().: 5,892,616
DATED : April 6, 1999
INVENTOR(S): Tsukasa TAKAHASHI

It is certified that error appears in the above-identified patent and that said Letters Patent is hereby corrected as shown below:

On the title page, [30] Foreign Application Priority Data, change "27" to --21--.

Signed and Sealed this

Thirtieth Day of November, 1999

Attest:

Q. TODD DICKINSON

*Attesting Officer*　　　*Acting Commissioner of Patents and Trademarks*